(12) United States Patent
Takahashi et al.

(10) Patent No.: US 6,436,467 B1
(45) Date of Patent: Aug. 20, 2002

(54) FLEXIBLE PRINTED BOARD AND METHOD OF MANUFACTURING SAME

(75) Inventors: Satoshi Takahashi; Hiromasa Ota, both of Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/343,657

(22) Filed: Jun. 29, 1999

(30) Foreign Application Priority Data

Jun. 29, 1998 (JP) .......................................... 10-182992

(51) Int. Cl.$^7$ ................................................ B05D 5/12
(52) U.S. Cl. ...................... 427/96; 427/384; 427/385.5; 427/402
(58) Field of Search ...................... 427/96, 384, 385.5, 427/402

(56) References Cited

U.S. PATENT DOCUMENTS 5,570,506 A * 11/1996 Tawata et al. ................. 29/851

FOREIGN PATENT DOCUMENTS

| JP | 129862 | * 12/1974 |
| JP | 160780 | * 7/1991 |

* cited by examiner

*Primary Examiner*—Brian K. Talbot
(74) *Attorney, Agent, or Firm*—Jay H. Maioli

(57) ABSTRACT

A flexible printed board is which has increased bonding strength, with which dispersion of the bonding strength can be prevented, the quality of which can be uniformed, with which curling can satisfactorily be prevented, which exhibits excellent dimensional stability and with which a precise circuit can satisfactorily be formed. A flexible printed board has a copper foil on which first and second polyimide-resin layers are sequentially laminated. The first polyimide layer made contact with the copper foil is formed by forming, turning into an imide, a polyimide precursor which contains polyamic acid components prepared owing to reactions of acid anhydride and amine and polyimide components prepared owing to reactions of acid anhydride and isocyanate.

6 Claims, 4 Drawing Sheets

FLEXIBLE PRINTED BOARD AND METHOD OF MANUFACTURING SAME

BACKGROUND OF THE INVENTION

1. Field of the Invention

The present invention relates to a flexible printed board which is a base board of a flexible printed circuit board for establishing the electrical connection in, for example, an electronic apparatus. More particularly, the present invention relates to a flexible printed board which has an insulator in the form of a polyimide-resin layer formed on a conductor thereof More particularly, the present invention relates to an improvement in the bonding characteristic of a flexible printed board and prevention of curling.

2. Description of the Related Art

To reduce the size and cost of a so-called portable electric product, such as a portable recording/reproducing apparatus, the flexible printed circuit board is usually employed. The flexible printed circuit board establishes the connection among the electric circuits to one another, the flexible printed circuit board being a relatively low cost board which permits space saving. The conventional flexible printed circuit board has circuits formed on a conductor of a flexible printed board, which is a base board thereof, by etching the conductor.

The flexible printed board, which is the base board for the flexible printed circuit board, usually incorporates polyimide films because of satisfactory flexibility and heat resistance of the polyimide films. Specifically, a double-layer flexible printed board 50 structured as shown in FIG. 1 has been disclosed and put into practical use. That is, copper foil 51 is directly coated with varnish for a polyimide precursor, the varnish being made of polyamic acid. The polyimide precursor is dried and turned into an imide so that a polyimide-resin layer 52 is formed.

The foregoing double-layer flexible printed board 50, however, suffers from a problem in that curling undesirably occurs because the polyamic acid used to coat the metal foil 51 is turned into an imide at high temperatures.

It can be considered that the curling is caused from the difference between the thermal contraction ratio of the metal foil 51 and that of the polyimide-resin layer 52. The difference occurs after the temperature of the polyimide-resin layer 52 has been lowered to room temperatures after the imidation has been realized. The difference in the thermal contraction ratio is caused from the difference between the thermal expansion of the metal foil 51 and that of the polyimide-resin layer 52.

For the purpose of overcoming the curing and other drawbacks, Japanese Patent Laid-Open No. 8-250860 has disclosed a double-layer flexible printed board.

That is, the disclosed double-layer flexible printed board has a multi-layer structure with polyimide layers, whereby the difference in the coefficient of linear thermal expansion of the metal foil and that of polyimide-resin layer becomes low.

As a result, the double-layer flexible printed board has little curling on forming the polyimide-resin layer on the copper foil.

The foregoing method has the step of adjusting the coefficient of thermal expansion of the polyimide-resin layer including the copper foil. Thus, the foregoing method, however, encounters re-occurrence of curling after the flexible printed circuit board has been manufactured by forming a circuit pattern through etching of the copper foil which is performed after the flexible printed board has been manufactured. That is, the foregoing method cannot correct the curling after the circuit has been formed.

Another reason why the curling of the double-layer flexible printed board occurs is that the material is contracted when the polyimide precursor is turned into an imide. The contraction causes the above-mentioned curling to occur.

The phenomenon of the occurrence of curling which is caused from the contraction of the material occurring when the polyimide precursor is turned into an imide cannot effectively be prevented as yet. Therefore, the conventional double-layer flexible printed board cannot completely remove the curling. The curling causes the accuracy between the conductors of the circuit after the etching process has been completed to deteriorate. Thus, the double-layer flexible printed board cannot satisfactorily form a precise pattern which has been required to furthermore improve the degree of precision.

Since the contraction of the material occurs when the polyimide precursor is turned into an imide, distortion occurs between the copper foil 51 and the polyimide-resin layer 52. As a result, there arises another problem in that the bonding strength decreases.

The conventional double-layer flexible printed board has been manufactured as shown in FIG. 2 such that a film 53 formed by coating the surface of the copper foil with the varnish for the polyimide precursor and made of the polyamic acid is wound into a roll shape. Then, heat treatment is performed in the foregoing state to turn the varnish for a polyimide precursor into an imide.

Since the rolled material is subjected to the heat treatment when the imidation is carried out, the overall body of the rolled film 53 cannot uniformly be subjected to the heat treatment. As a result, the flexible printed board 50 unwound from the rolled state after the imidation has been realized suffers from the following problem: the bonding strength disperses between the copper foil 51 and the polyimide-resin layer 52 in a core portion 53a nearest the winding shaft, an intermediate portion 53b and an outer portion 53c. As a result, a uniform quality cannot be obtained. Specifically, the portion from the core portion 53a to the intermediate portion 53b suffers from instable bonding strength between the copper foil and the polyimide-resin layer.

SUMMARY OF THE INVENTION

In view of the foregoing, an object of the present invention is to provide a flexible printed board for improving the bonding strength and its non-dispersion.

Another object of the present invention is to provide a flexible printed board for improving curling and the dimensional stability for forming a fine circuit.

To achieve the above-mentioned objectives, according to one aspect of the present invention, there is provided a flexible printed board comprising:

at least one or more polyimide-resin layers formed on a conductor thereof, wherein the polyimide-resin layer which is in contact with the conductor is obtained by forming, and turning into an imide, a polyimide precursor which contains polyamic acid components prepared owing to reactions of acid anhydride and amine and expressed by the following chemical formula (5) and polyimide components prepared owing to reactions of acid anhydride and isocyanate and expressed by the following chemical formula (6):

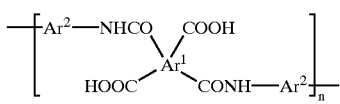

(5)

where each of $Ar^1$ and $Ar^2$ is an aromatic group and n is an integer,

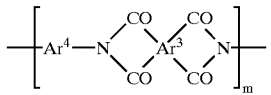

(6)

where each of $Ar^3$ and $Ar^4$ is an aromatic group and in is an integer.

As described above, the flexible printed board according to the present invention incorporates the polyimide precursor which is the material of the polyimide-resin layer and made contact with the conductor contains the polyimide components expressed by chemical formula 6 as well as the polyamic acid components expressed by chemical formula 5.

The flexible printed board according to the present invention incorporates the polyimide precursor, which is the material of the polyimide-resin layer made contact with the conductor, is previously turned into an imide before the imidation is performed. Therefore, contraction of the material caused from the imidation of the polyimide precursor can be prevented. As a result, the flexible printed board according to the present invention is able to prevent distortion occurring between the conductor and the polyimide-resin layer which is made contact with the conductor when the imidation is performed. Therefore, the bonding strength between the conductor and the polyimide-resin layer can be increased.

Moreover, the flexible printed board according to the present invention is able to prevent contraction of the material when the rolling and imidation is performed. Therefore, dispersion of bonding strength between the conductor and the polyimide-resin layer can be prevented in the core portion, the intermediate portion and the wound portion in a state of the flexible printed board subjected to the imidation and the unwinding process have been completed. As a result, the quality can satisfactorily be uniformed.

Moreover, the flexible printed board according to the present invention is able to prevent contraction of the material caused from the imidation of the polyimide precursor. Therefore, curling can be minimized.

According to another aspect of the present invention, there is provided a method of manufacturing a flexible printed board comprising the steps of: forming a first polyimide-precursor-layer by coating a conductor with varnish for a first polyimide precursor containing polyamic acid components prepared owing to reactions of acid anhydride and amine and expressed by the following chemical formula 7 and polyimide components prepared owing to reactions of acid anhydride and isocyanate and expressed by the following chemical formula 8; coating the surface of the first polyimide-precursor-layer with varnish for a second polyimide precursor composed of polyamic acid components prepared owing to reactions of acid anhydride and amine; and subjecting the first polyimide-precursor-layer and the second polyimide-precursor-layer to heat treatment so as to turn the first and second polyimide precursors into an imide so that the first and second polyimide-resin layers are formed.

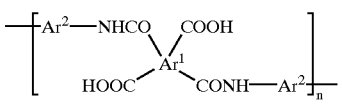

(7)

where each of $Ar^1$ and $Ar^2$ is an aromatic group and n is an integer

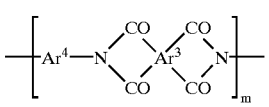

(8)

where each of $Ar^3$ and $A^4$ is an aromatic group and m is an integer

As described above, the method of manufacturing the flexible printed board according to the present invention employs the polyamic acid expressed by chemical formula 7 and the polyimide components expressed by chemical formula 8 as the polyimide precursor which is the material of the first polyimide-resin layer made contact with the conductor so that the precursor layer for the polyimide is formed.

That is, the method of manufacturing the flexible printed board according to the present invention employs the material previously turned into an imide before the imidation is performed as the polyimide precursor which is the material of the first polyimide-resin layer. Therefore, contraction of the material caused from the imidation of the polyimide precursor can be prevented. As a result, the method of manufacturing the flexible printed board according to the present invention is able to prevent distortion occurring between the conductor and the first polyimide-resin layer when the imidation is performed. As a result, the bonding strength between the conductor and the polyimide-resin layer can be increased.

The method of manufacturing the flexible printed board according to the present invention is able to prevent contraction of the material when the rolling and imidation is performed. Therefore, dispersion of the bonding strength between the conductor and the first polyimide-resin layer in the core portion, the intermediate portion and the wound portion of the unwound flexible printed board subjected to the imidation can be prevented. Thus, the quality can significantly be uniformed.

Moreover, the method of manufacturing the flexible printed board according to the present invention is able to prevent contraction of the material caused from the imidation of the polyimide precursor. Therefore, curling can be prevented.

Other objects, features and advantages of the invention will be evident from the following detailed description of the preferred embodiments described in conjunction with the attached drawings.

DESCRIPTION OF THE PREFERRED EMBODIMENTS

Figure 1:
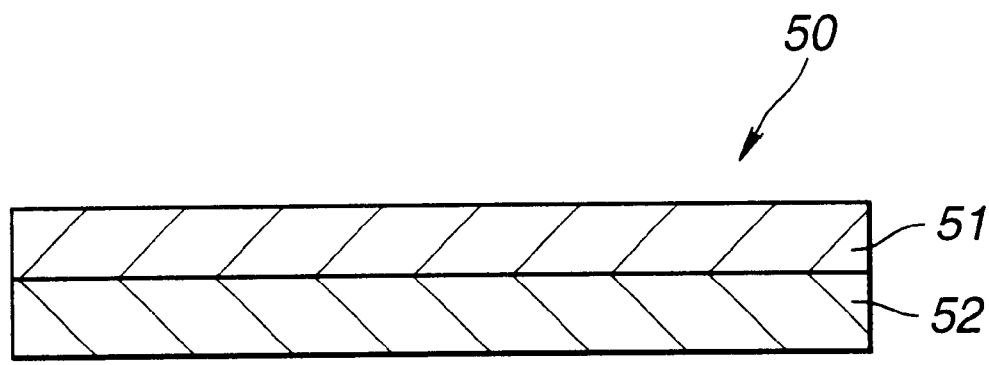
FIG. 1 is a cross sectional view showing an example of a conventional flexible printed board.
Figure 2:
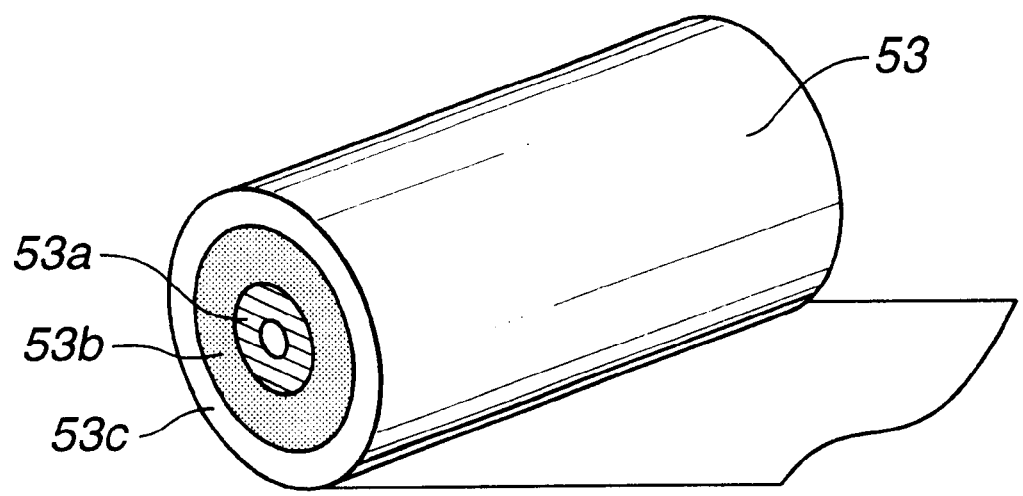
FIG. 2 is a perspective view showing an imidation for manufacturing the conventional flexible printed board.
Figure 3:
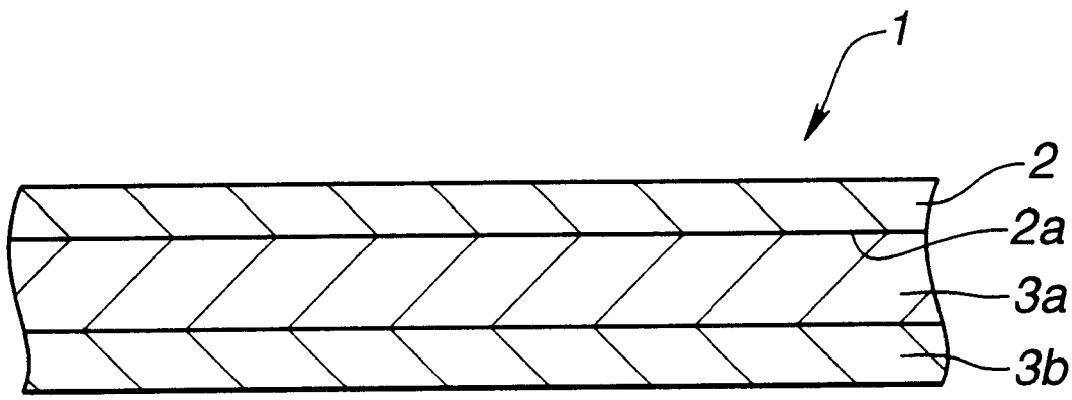
FIG. 3 is a cross sectional view showing an example of a flexible printed board according to the present invention.

Embodiments of the present invention will now be described with reference to the drawings. FIG. 3 is a cross sectional view showing an example of a flexible printed board 1 according to the present invention.

The flexible printed board 1 according to the present invention, as shown in FIG. 3, incorporates copper foil 2 which has a main surface 2a on which a first polyimide layer 3a and a second polyimide layer 3b are sequentially formed. The copper foil 2 of the flexible printed board 1 is etched so that a predetermined circuit pattern is formed on the copper foil 2. Thus, a flexible printed circuit board for use to establish the electrical connection in, for example, an electronic apparatus can be obtained.

Specifically, the copper foil 2 may be electrolytic copper foil or rolled copper foil. The thickness of the copper foil 2 is 35 μm or smaller. It is preferable that the thickness is 8 μm to 18 μm to form a precise circuit. If the thickness of the copper foil 2 is 18 μm or larger, the precise circuit cannot easily be formed. If the thickness of the copper foil 2 is 8 μm or smaller, creases inhibiting a smooth coating process are formed.

When the copper foil 2 is subjected to heat treatment in an atmosphere, the temperature of which is 250° C. to 400° C. at which the first polyimide layer 3a and the second polyimide layer 3b are turned into an imide, the copper foil 2 has a characteristic that its coefficient of linear thermal expansion is raised. The coefficient of linear thermal expansion of the copper foil 2 is $16.0 \times 10^{-6}$/K to $18.0 \times 10^{-6}$/K before the imidation. After the imidation has been completed, the coefficient of linear thermal expansion is $18.0 \times 10^{-6}$/K to $20.0 \times 10^{-6}$/K.

It is ideal that the copper foil 2 is copper foil which is not subjected to surface treatment. If the copper foil 2 is subjected to the surface treatment using zinc or chrome or using oxidation, the average roughness Ra on the central line must be 10 μm or smaller, preferably 7 μm or smaller.

The conductor of the flexible printed board 1 according to the present invention is not limited to the copper foil 2. The conductor may be metal foil made of aluminum or iron. Metal foil may be employed which is composed of alloy of the foregoing metal and beryllium, nickel, chrome or tungsten. For example, beryllium foil or stainless steel foil may be employed. As an alternative to this, composite foil of copper and aluminum may be employed.

To increase the bonding strength, the surface of the metal foil may be subjected to a matting process, nickel or zinc plating or oxidation to decrease the bonding strength. In addition, the metal foil may be subjected to chemical surface treatment using aluminum alcoholate, aluminum chelate, silane coupling material or imidazole.

The flexible printed board 1 according to the present invention incorporates the first polyimide layer 3a which is made contact with the copper foil 2. The first polyimide layer 3a is formed by forming, turning into an imide, a polyimide precursor. The polyimide precursor contains polyamic acid components prepared by allowing acid anhydride and amine to react with each other and expressed by chemical formula (9) and polyimide components prepared by allowing acid anhydride and isocyanate to react with each other and expressed by chemical formula (10).

That is, the flexible printed board 1 according to the present invention incorporates the first polyimide layer 3a which is made of varnish for the first polyimide precursor which contains the polyimide components expressed by the chemical formula (10). Therefore, the varnish for the first polyimide precursor is partially turned into an imide before the imidation is performed. Specifically, the varnish for the first polyimide precursor is partially turned into an imide by diisocyanate components as described later.

The varnish for the first polyimide precursor is applied to the copper foil 2, and then dried. Then, the imidation is performed so that the first polyimide layer 3a is formed.

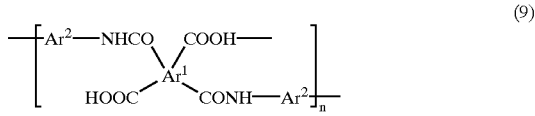

(9)

where each of $Ar^1$ and $Ar^2$ is an aromatic group and n is an integer,

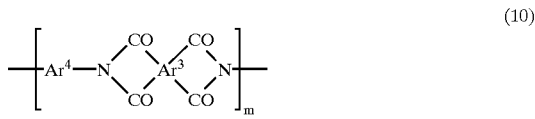

(10)

where each of $Ar^3$ and $Ar^4$ is an aromatic group and m is an integer.

The component expressed by chemical formula (9) is a usual polyamic acid component prepared by condensing acid dihydrate and aromatic diamine. Therefore, each of $Ar^1$ and $Ar^2$ expressed by chemical formula (9) is an aromatic ring portion composed of the following acid dihydrate and the aromatic diamine. Note that the aromatic ring portion may include a portion appropriately substituted.

The acid dihydrate may be any one of the following materials: pyromellitic acid dihydrate; biphenyl tetra carboxylic acid dihydrate; bis (dicarboxyphenyl) sulfonic acid dihydrate; bis (dicarboxyphenyl) ether dihydrate; and benzophenone tetracarboxylic acid dihydrate.

The aromatic diamine may be any one of the following materials: o-, m- and p-phenylene diamine; 4, 4 diaminodiphenyl ether; 2, 2-bis [4-(4-aminophenoxy) phenyl] propane; 2, 2-bis [4-(4-aminophenoxy) phenyl] sulfone; 4, 4-diaminobenzanilide; 1, 4-bis (4-aminophenoxy) benzene; and 3, 3-dimethyl-4, 4'-diamine biphenyl.

The component expressed by chemical formula (10) is in the form of an imide ring obtained by allowing aromatic diisocyanate to react (perform an imidation) with the acid dihydrate. Therefore, each of $Ar^3$ and $Ar^4$ expressed by chemical formula (10) is an aromatic ring portion composed of a condensate of the following aromatic diisocyanate compound and the acid dihydrate. Note that the aromatic ring portion may arbitrarily be substituted.

The aromatic diisocyanate compound is exemplified by 4, 4'-diphenyl methane diisocyanate, 2, 4-trilene diisocyanate, tolidine diisocyanate, 1, 5-naphthalene diisocyanate, hexamethylene diisocyanate and xylylene diisocyanate.

As described above, the flexible printed board 1 according to the present invention has the structure that the varnish for a polyimide precursor for use as the material of the first polyimide layer 3a made contact with the copper foil 2 contains the polyimide components expressed by chemical formula (10).

That is, the flexible printed board 1 according to the present invention has the structure that the polyimide precursor which is the material of the first polyimide layer 3a is partially turned into an imide before the imidation is performed. Therefore, contraction of the material caused from the imidation of the polyimide precursor, which is the material of the first polyimide layer 3a, can be prevented. As a result, the flexible printed board 1 according to the present invention is able to prevent distortion occurring between the copper foil 2 and the first polyimide layer 3a when the imidation is performed. As a result, the bonding strength between the copper foil 2 and the first polyimide layer 3a can be increased.

Moreover, the flexible printed board 1 according to the present invention is able to prevent contraction of the material occurring when the rolling and imidation is performed. Therefore, the unwound flexible printed board after the imidation has been completed is free from dispersion of the bonding strength between the copper foil 2 and the first polyimide layer 3a in each of the core portion, the intermediate portion and the wound portion of the flexible printed board. As a result, the quality can satisfactorily be uniformed so that the quality is improved.

The flexible printed board 1 according to the present invention is able to prevent contraction of the material caused from the imidation of the polyimide precursor. Therefore, curling can satisfactorily be prevented. Thus, excellent flatness can be realized.

It is preferable that the ratio of the component expressed by chemical formula (10) in the varnish for a polyimide precursor for use in the first polyimide layer 3a is 10 mol % to 70 mol % when the sum of the components expressed by chemical formulas 9 and 10 is 100 mol %. More preferably, the foregoing ratio is 30 mol % to 50 mol %.

The number of moles of the foregoing aromatic diisocyanate compound is called an imidation ratio of polyamic acid. It is preferable that the varnish for the first polyimide precursor of the first polyimide layer 3a contains the polyimide component expressed by chemical formula (10) by 10 mol % to 70 mol % before the imidation. More preferably, the varnish for a polyimide precursor is turned into an imide by 30 mol % to 50 mol %. Namely, it is preferable that the ratio (hereinafter called a "previous imidation ratio") of the partial imidation of the varnish for the first polyimide precursor is 10 mol % to 70 mol %, more preferably 30 mol % to 50 mol %.

If the previous imidation ratio is lower than 10 mol %, the flexible printed board 1 suffers from easy occurrence of curling. If the previous imidation ratio is 70 mol % or higher, the bonding strength between the copper foil 2 and the first polyimide layer 3a decreases. Polyimide resin of a type having a coefficient of linear thermal expansion of $30 \times 10^{-6}$/K or lower in a state in which a portion of the polyamic acid which is the precursor has been partially turned into an imide, the polyimide resin cannot easily be dissolved in polar solvent. The polar solvent is exemplified by N-methyl-2-pyrolidone or dimethyl acetoamide. As a result, the resin is undesirably separated or the polyamic acid solution is gelled or the viscosity of the resin is raised excessively. Moreover, the polyamic acid cannot easily be applied to the surface of the copper foil 2. Therefore, it is preferable that the upper limit of the previous imidation ratio is 70 mol %.

The varnish for the first polyimide precursor for use in the first polyimide layer 3a is subjected to the heat treatment at high temperatures during the imidation. To prevent thermal expansion caused from the heat treatment performed at high temperatures, a material having a glass transition temperature Tg in the range of the previous imidation ratio must be employed. It is ideal that the glass transition temperature Tg of the varnish for the first polyimide precursor is 250° C. or higher. If the glass transition temperature is 250° C. or lower, the temperature at which the imidation is performed must be high temperatures of 300° C. to 400° C. Therefore, great dispersion in the bonding strength of the first polyimide layer 3a with respect to the copper foil 2 in the widthwise direction and the lengthwise direction takes place. In addition, great dispersion of the coefficient of contraction of the flexible printed circuit board takes place after the circuit has been formed by removing the copper foil 2 of the flexible printed board 1 by etching. As a result, the dimensional stability deteriorates.

The second polyimide layer 3b is formed by applying the varnish for the second polyimide precursor mainly composed of polyamic acid which is the polyimide precursor resin and which is a condensation product of acid dihydrate and aromatic diamine. Then, the varnish for the second polyimide precursor is dried and turned into an imide.

The acid dihydrate and the aromatic diamine may be the acid dihydrate and the aromatic diamine similar to those for use in the polyimide precursor of the first polyimide layer 3a.

The carboxylic group of the polyamic acid solution which is the polyimide precursor for the first polyimide layers 3a and 3b is able to cause the metal foil, such as the copper foil 2 to have rust. Therefore, a rust-preventive agent may be added. The rust-preventive agent having the rust-preventive function is able to increase the bonding strength with the metal foil. The rust-preventive agent is exemplified by a triazole compound, such as 3-(N-salicyloyl) amino-1, 2, 3-triazole; an imidazole compound, such as 2-methylimidazole; and its salt. It is preferable that the rust-preventive agent is added by 1 to 10 parts by weight with respect to 100 parts by weight of the polyamic acid.

The polyimide-resin layer in the form of the multilayered structure may be added to epoxy resin to increase the bonding strength to prevent separation between the first polyimide layers 3a and 3b or to increase the bonding strength with the metal foil, such as the copper foil 2. The epoxy resin may be general-purpose epoxy resin, such as bisphenol type or novolak phenol type epoxy resin. Although the hardening material made of the epoxy resin is not necessarily required, the epoxy resin may be added to the polyamic acid solution. In the foregoing case, the hardening material is added to the polyamic acid solution.

It is preferable that the coefficient of linear thermal expansion of the second polyimide layer 3b is $30 \times 10^{-6}$/K or lower. That is, it is preferable that the coefficient of linear thermal expansion of the polyimide precursor for the second polyimide layer $3b$ is $30 \times 10^{-6}$/K or lower after the polyimide precursor has been turned into an imide. If the coefficient of linear thermal expansion of the second polyimide layer $3b$ is higher than $30 \times 10^{-6}$/K, the flexible printed circuit board manufactured by removing the copper foil 2 of the flexible printed board 1 by etching cannot be flattened.

As described above, the flexible printed board 1 according to the present invention has the structure that the coefficient of linear thermal expansion of the second polyimide layer $3b$ laminated on the first polyimide layer $3a$ which is made contact with the upper surface of the copper foil 2 is specified. Therefore, curling can effectively be prevented. As a result, a precise circuit required to perform a denser mounting can be realized.

The coefficient of linear expansion can arbitrarily be adjusted as disclosed in Japanese Patent Laid-Open No. 60-157286, Japanese Patent Laid-Open No. 60-243120, Japanese Patent Laid-Open No. 63-239998, Japanese Patent Laid-Open No. 1-245586, Japanese Patent Laid-Open No. 3-123093 and Japanese Patent Laid-Open No. 5-1390527. That is, the coefficient of linear thermal expansion can arbitrarily be adjusted by changing the combination of the conventional acid dihydrate and the aromatic diamine, their chemical structures and the mixture ratio.

The flexible printed board according to the present invention is not limited to the structure having two polyimide-resin layers as shown in FIG. 3. A multilayered structure having a plurality of polyimide-resin layers laminated on the copper foil 2 may be employed. It is preferable that the number of the polyimide-resin layers is three or smaller. If the number of the layers is four or more, the cost is enlarged excessively.

Figure 4:
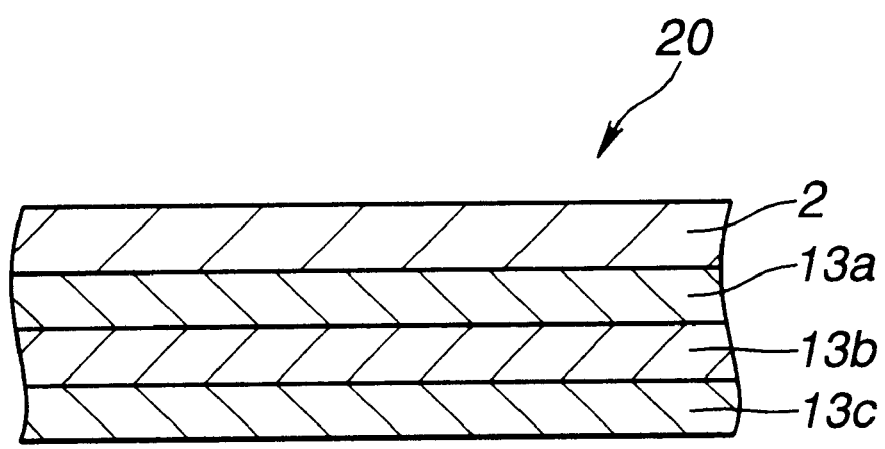
FIG. 4 is a cross sectional view showing another example of the flexible printed board according to the present invention.

Specifically, a flexible printed board 20 according to the present invention, as shown in FIG. 4, incorporates a copper foil 2 on which a first polyimide-resin layer $13a$, a second polyimide-resin layer $13b$ and a third polyimide-resin layer $13c$ are sequentially laminated. Similarly to the first polyimide layer $3a$ of the flexible printed board 1 shown in FIG. 3, the first polyimide-resin layer $13a$ is obtained by performing imidation of varnish for the first polyimide precursor which has been partially turned into an imide. Similarly to the second polyimide layer $3b$ of the flexible printed board 1 shown in FIG. 3, the second polyimide-resin layer $13b$ is obtained by turning known solution into an imide.

Similarly to the second polyimide-resin layer $13b$, the third polyimide-resin layer $13c$ is obtained by turning known polyamic acid solution into an imide. It is preferable that the coefficient of linear thermal expansion of the third polyimide-resin layer $13c$ formed on the outer portion of the flexible printed board 20 is higher than that of the second polyimide-resin layer $13b$ formed in the central portion. As a result of the above-mentioned structure, the bonding strength with the copper foil 2 can be increased. Moreover, curling of the flexible printed board 20 can be prevented.

It is preferable that the coefficient of linear thermal expansion of the first polyimide-resin layer $13a$ adjacent to the copper foil 2 is somewhat higher than that of the third polyimide-resin layer $13c$ which is the outer layer. The reason for this lies in that the roughness of the surface of the copper foil 2 exerts an influence on the curling.

As a result of the multilayered structure composed of the polyimide-resin layers, the coefficient of linear thermal expansion can be adjusted to be closer to that of the copper foil 2. As a result, curling can be prevented. When the thickness of the outer polyimide-resin layer with respect to the copper foil 2 is adjusted, curling can be prevented.

A structure of the flexible printed board according to the present invention will now be described in which improvement of the bonding strength with the copper foil 2 is attempted and prevention of dispersion of the bonding strength is attempted. In the foregoing case, a single polyimide-resin layer may be formed on the copper foil 2. The polyimide precursor partially turned into an imide expressed by chemical formulas 9 and 10 is used to turn the polyimide precursor into an imide so that the polyimide-resin layer is formed. When prevention of the curling is furthermore effectively performed as well as the increase in the bonding strength, it is preferable that the coefficient of linear thermal expansion of the second polyimide-resin layer which is laminated on the first polyimide-resin layer made contact with the copper foil 2 is specified.

A method of manufacturing the flexible printed board 1 having the above-mentioned structure and according to the present invention will now be described with reference to the drawings.

Figure 5:
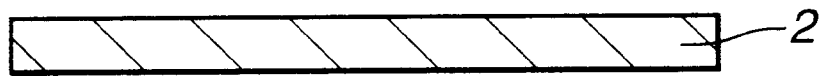
FIG. 5 is a cross sectional view showing a step of preparing copper foil included in a process for manufacturing the flexible printed board according to the present invention.

Initially, the copper foil 2, which is the conductor formed as shown in FIG. 5, is prepared.

Then, the varnish for the first polyimide precursor, which is the material of the first polyimide layer $3a$ which is formed on the copper foil 2, is prepared. Initially, acid dihydrate and aromatic diamine in excess quantities are dissolved in solvent to allow the materials to react with each other. Thus, polyamic acid prepolymer having acid dihydrate at the two terminals thereof is prepared. Then, the aromatic diisocyanate compound is added to the polyamic acid prepolymer to allow acid dihydrate and aromatic diisocyanate in the polyamic acid prepolymer to react with each other. Thus, polyamic acid solution having the imide ring is directly prepared. At this time, the reactions with the aromatic diisocyanate can be performed under a moderate condition at, for example, 60° C. because acid dihydrate is able to react easily as compared with the carboxylic group of polyamic acid.

The solvent may be pyrolidone solvent, such as N-methyl-2-pyrolidone; acetoamide solvent, such as N, N'-dimethylacetoamide; or phenol solvent, such as cresol. From a viewpoint of safety, it is preferable that N-methyl-2-pyrolidone is employed. Moreover, xylene, toluene or ethylene glycol monoethylether may be mixed.

Thus, varnish for the first polyimide precursor for the first polyimide layer $3a$ and partially turned into an imide can be prepared.

Figure 6:
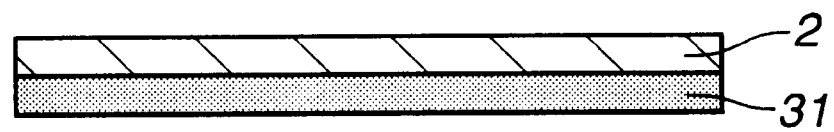
FIG. 6 is a cross sectional view showing a step of forming a first polyimide-precursor-layer on copper foil included in the process for manufacturing the flexible printed board according to the present invention.

Then, the thus-prepared varnish for the first polyimide precursor is, as shown in FIG. 6, applied to the surface of the copper foil 2 by a known coating method using a knife coater or a bar coater to have a thickness of 1 $\mu$m to 5 $\mu$m. Then, the varnish for the first polyimide precursor is dried in a continuously drying furnace to volatilize the solvent in a predetermined quantity so that the first polyimide-precursor-layer 31 partially turned into an imide is formed. It is preferable that the continuously drying furnace is an arch type furnace or a floating furnace to prevent curling. The type of the furnace is not limited to the foregoing furnaces.

The drying temperature is determined in accordance with the percentage of residual quantity from volatilization of the polyimide precursor. It can be considered that the residual quantity from volatilization is the sum of the quantity of non-dried solvent and that of condensed water generated owing to the imidation.

At this time, it is preferable that the residual quantity from volatilization of the first polyimide-precursor-layer 31 is 20% to 30%. If the percentage is lower than 20%, the bonding strength with the second polyimide layer $3b$ which is formed later decreases. Thus, separation of the layers easily occurs. If the percentage is 30% or higher, the bonding strength between the metal foil and the polyimide-resin layer of the manufactured flexible printed board 1 and contraction of the flexible printed board 1 after the imidation has been completed cannot be stabilized in the core portion, the intermediate portion and the wound portion. Thus, a uniform quality cannot be realized. If the percentage is 30% or higher, there is apprehension that a bubble is undesirably formed during the imidation.

Then, varnish for the second polyimide precursor for the second polyimide layer 3b which is formed on the first polyimide-precursor-layer 31 is prepared as follows.

The foregoing varnish for the second polyimide precursor is prepared by allowing acid dihydrate and aromatic diisocyanate to react with each other in polar solvent similarly to that employed to prepare the varnish for the first polyimide precursor. Since the foregoing reaction is a heat generating reaction, the reaction is controlled while the materials are being cooled down if necessary. The reaction is usually performed at about 0° C. to 90° C., preferably about 5° C. to 50° C. If the solution has excessively high viscosity, heat treatment is performed at about 90° C. Thus, the viscosity can be lowered. At this time, acid dihydrate and the aromatic diamine may simultaneously be added. As an alternative to this, either of the two materials is previously dissolved or suspended in the polar solvent, and then the other material is gradually added to cause the reaction to occur. It is preferable that the acid dihydrate and the aromatic diamine are added at the same molar ratio. Either of the two components may be added in a larger quantity while a range about 10:9 to 9:10 is being satisfied.

Thus, the varnish for the second polyimide precursor for use to form the second polyimide-resin layer can be prepared.

Figure 7:
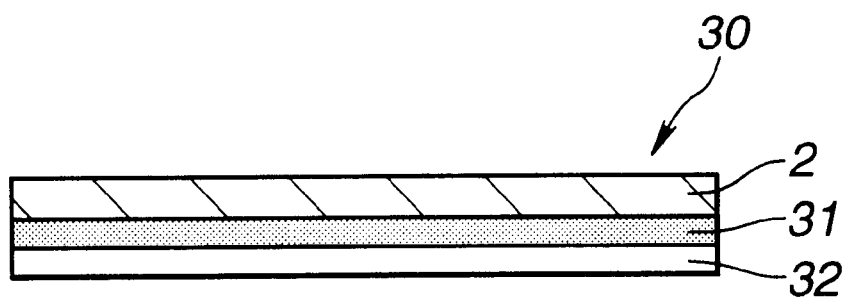
FIG. 7 is a cross sectional view showing a step of forming a second polyimide-precursor-layer on the first polyimide-precursor-layer included in the process for manufacturing the flexible printed board according to the present invention.

Then, the thus-prepared varnish for the second polyimide precursor is, as shown in FIG. 7, applied to the surface of the first polyimide-precursor-layer 31. Then, a drying process is performed in the continuously drying furnace to volatilize the solvent in a predetermined quantity. Thus, a second polyimide-precursor-layer 32 is formed. As a result, a metal composite film 30 is obtained. The continuous furnace may be a furnace similar to that employed to form the first polyimide-precursor-layer 31.

It is preferable that the residual quantity from volatilization which is the sum of the first polyimide-precursor-layer 31 and the second polyimide-precursor-layer 32 is 30% to 50%. If the quantity is lower than 30%, the bonding strength with the second polyimide layer 3b which will be turned into an imide decreases. Therefore, separation of the layers easily occurs. If the quantity is higher than 50%, formation of a bubble in a next step cannot be prevented. Therefore, the temperature of the continuous furnace is not limited particularly if formation of a bubble can be prevented. When N-methyl-2-pyrolidone having a boiling point of 204° C. is used as the solvent, the highest temperature must be 170° C. to make the residual quantity from volatilization to be 50% or lower.

The solvent is left in each of the thus-formed first polyimide-precursor-layer 31 and the second polyimide-precursor-layer 32 in a considerably large quantity. Therefore, it is preferable that heat treatment is performed to volatilize the solvent.

It is preferable that the drying temperature is 210° C. to 250° C. It is preferable that the overall residual quantity from volatilization of the first polyimide-precursor-layer 31 and 32 is adjusted to about 7% to 10% as a result of the foregoing heat treatment. If the temperature is 250° C. or higher, polyamic acid in the first polyimide-precursor-layer 31 made contact with the copper foil 2 is undesirably turned into an imide. In this case, there is apprehension that the imidation ratio is deviated from the foregoing predetermined range before the imidation. As a result, curling of the metal composite film 30 cannot easily be prevented. If the temperature is 210° C. or lower, the residual quantity of the volatilization cannot be lowered to 7% or lower. If the residual quantity from volatilization is not lowered to 7% or lower by performing the foregoing heat treatment, blocking takes place in the next step for performing the imidation of the rolled product. In the foregoing case, sticking of the metal composite films 30 cannot be prevented.

Figure 8:
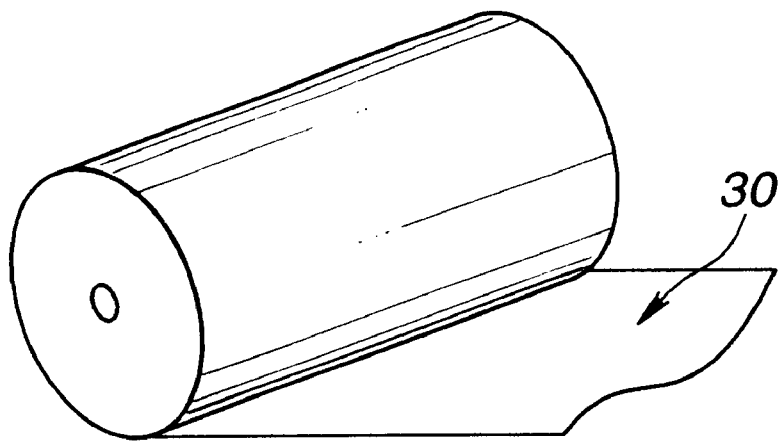
FIG. 8 is a perspective view showing a rolling and imide forming step included in the process for manufacturing the flexible printed board according to the present invention.
Figure 9:
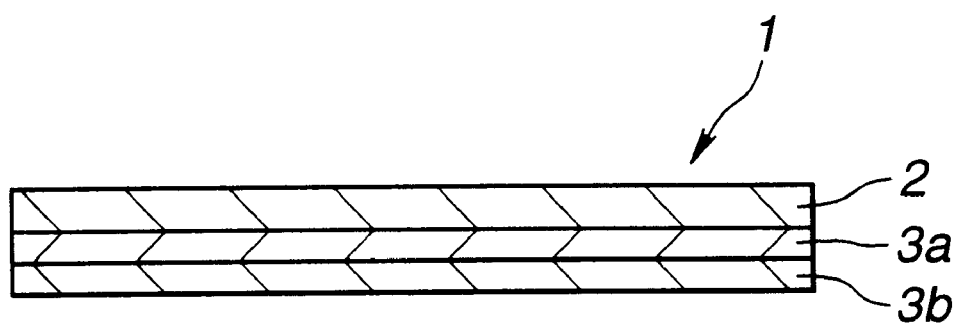
FIG. 9 is a cross sectional view showing a step with which the flexible printed board is obtained by unwinding the roll after the imidation has been completed and which is included in the process for manufacturing the flexible printed board according to the present invention.

Then, as shown in FIG. 8, the metal composite film 30 is wound into a roll shape. Then, the metal composite film 30 is subjected to heat treatment at a temperature range from 300° C. to 350° C. Thus, the first and second polyimide-precursor-layers 31 and 32 are turned into an imide in a stroke. Finally, the flexible printed board 1 having the first and second polyimide layers 3a and 3b formed on the copper foil 2 as shown in FIG. 9 is manufactured.

When a flexible printed board having three or more polyimide-resin layers is manufactured, a process similar to that shown in FIG. 7 is performed. Thus, the polyimide precursor layers are sequentially applied and dried to form a laminate. Then, a process similar to that shown in FIG. 8 is performed so that the imidation is performed.

A structure of the flexible printed board has been disclosed which is formed such that the polyimide-resin layer which is formed on the conductor has the structure expressed by chemical formula (10). However, the conventional polyimide-resin layer is structured as expressed by chemical formula (10) by turning polyimide precursor composed of acid anhydride and diamine into an imide.

On the other hand, the flexible printed board 1 according to the present invention has the first polyimide layer 3a. The first polyimide layer 3a is formed by using polyimide precursor containing components partially turned into an imide and expressed by chemical formula (10). Thus, the components of the polyimide precursor which have not been turned into an imide are completely turned into an imide.

Therefore, the conventional structure and the present invention are different from each other in the component of the polyimide precursor resin layer which is formed on the conductor.

Another conventional flexible printed board has been disclosed which has multilayered structure polyimide-resin layers formed by laminating the polyimide-resin layers on the conductor. The foregoing conventional flexible printed board is manufactured such that the polyimide precursor is applied to the conductor. Then, the polyimide precursor is dried, and then application and drying of the polyimide precursor are sequentially repeated. Thus, the multilayered polyimide precursor is formed. Then, the multilayered structure polyimide precursor layers are, in a stroke, turned into an imide. Thus, the foregoing multilayered structure polyimide-resin layer is formed.

When the polyimide precursor is applied and dried, the polyimide precursor is somewhat turned into an imide. Therefore, the multilayered polyimide precursor is somewhat partially turned into an imide before the multilayered structure polyimide precursor layers are turned into an imide in a stroke.

The conventional flexible printed board has partially been turned into an imide as described above. However, the imidation ratio of the partially turned imide cannot easily be controlled from a viewpoint of performing the manufacturing process. Therefore, the foregoing flexible printed board is disadvantageous from a viewpoint of realizing a uniform quality required when mass production is performed.

The flexible printed board 1 according to the present invention is manufactured such that the polyimide precursor layer made contact with the conductor has been partially turned into an imide before the imidation is finally performed. It looks as if the flexible printed board according to the present invention resembles the conventional flexible printed board from the foregoing viewpoint. However, the conventional structure uses the somewhat and partial imidation of polyimide precursor during the drying process which is performed after polyimide precursor has been applied. On the other hand, the present invention uses the isocyanate component which is previously contained in the polyimide precursor to previously turn the polyimide precursor into an imide. The polyimide precursor which has been partially turned into an imide is positively used.

That is, as if the conventional structure and the present invention are the same from the viewpoint of using somewhat and partial imidation before the multilayered structure polyimide precursor is completely turned into an imide. The method of performing the partial imidation is different from each other. Moreover, the present invention uses the isocyanate component to perform the partial imidation. Therefore, the imidation ratio at which the partial imidation is performed, that is the previous imidation ratio can easily be controlled. Thus, a significant advantage can be realized when the manufacturing process is performed.

EXAMPLES

Examples of the present invention will now be described in accordance with results of experiments.

Initially, polyamic acid was prepared as follows. To measure the coefficient of linear thermal expansion of polyimide resin obtained by turning the prepared polyamic acid solution into an imide, the following polyimide film was manufactured.

<Preparation of Polyamic Acid Solution Partially Turned into an Imide>

Samples (1)-1

Initially, 120 g (0.6 mole) of 4, 4'-diaminodiphenyl ether (DPE) was dissolved in 2.0 kg of N-methyl-2-pyrolidone. While maintaining a temperature of 20° C., 218 g (1.0 mole) of pyromellitic acid dihydrate (PMDA) was added so as to be allowed to react for one hour. Thus, prepolymer having two terminals which were acid anhydride was obtained.

Then, 105.6 g (0.4 mole) of tolidineisocyanate (TODI) was added to the prepolymer of acid anhydride, and then the temperature was gradually raised to 60° C. In an initial stage of the foregoing reaction, formation of bubbles of carbon dioxide was observed. Moreover, the viscosity was raised. Then, 2.0 kg of N-methyl-2-pyrolidone was added so as to be allowed to react for two hours so that polyamic acid solution partially turned into an imide was obtained.

Samples (1)-2 to (1)-9

A process similar to sample (1)-1 was performed except for the types and ratios of acid dihydrate, aromatic diamine and aromatic diisocyanate which were varied as shown in Table 1. Thus, polyamic acid solution partially turned into an imide was obtained.

The characteristics of obtained polyamic acid solution partially turned into an imide were evaluated as follows. Results were shown in Table 1.

1. Measurement of Previous Imidation Ratio

The ratio, which was previously turned into an imide with respect to the polyamic acid solution partially turned into an imide, was called a previous imidation ratio. The previous imidation ratio of the polyamic acid solution was measured as follows.

An infrared-ray absorption analyzer and a surface reaction method (an ATR method) were employed so that a quantity of absorbed light when the absorption wavelength of an imide group was 1780 $cm^{-1}$ was calculated. The quantity was calculated from the percentage of the imide group with respect to the quantity of absorbed light when each sample was completely turned into an imide.

2. The viscosity of the polyamic acid solution partially turned into an imide and the ratio of a solid component were measured by a method using a type-B viscometer and a method using the quantity of reduction in the dry weight at 300° C.

3. Measurement of Glass Transition Temperature

The polyamic acid solution partially turned into an imide was applied to electrolytic copper foil having a thickness of 35 $\mu$m. Then, the solvent was dried so that the imidation was performed at 350° C. for 10 minutes. The copper foil was removed by etching so that a polyimide film was obtained. The glass transition temperature of the obtained polyimide film was measured by a differential scanning calorimeter (DSC) method.

TABLE 1

| Samples | Acid Dihydrate (mol) | Diamine (mol) | Aromatic Diisocyanate (mol) |
|---|---|---|---|
| (1)-1 | PMDA (1.0) | DPE (0.6) | TODI (0.4) |
| (1)-2 | PMDA (1.0) | DPE (0.9) | TODI (0.1) |
| (1)-3 | PMDA (1.0) | DPE (0.7) | TODI (0.3) |
| (1)-4 | PMDA (1.0) | DPE (0.5) | TODI (0.5) |
| (1)-5 | PMDA (1.0) | DPE (0.3) | TODI (0.7) |
| (1)-6 | PMDA (1.0) | DPE (0.6) | NDI (0.4) |
| (1)-7 | PMDA (1.0) | DPE (0.6) | NDI (0.4) |
| (1)-8 | BPDA (1.0) | DPE (0.6) | NDI (0.4) |
| (1)-9 | BPDA (1.0) | DPE (0.6) | TODI (0.4) |

| | Previous Imidation Ratio (mol %) | State of Solution | | Glass Transition Temperature (° C.) |
|---|---|---|---|---|
| | | Viscosity (Pa · S) | Ratio of Solid Component (%) | |
| (1)-1 | 40 | 20 | 10 | 305 |
| (1)-2 | 10 | 7 | 10 | 285 |
| (1)-3 | 30 | 15 | 10 | 290 |
| (1)-4 | 50 | 25 | 8 | 300 |
| (1)-5 | 70 | 30 | 8 | 315 |
| (1)-6 | 80 | gelled | — | — |
| (1)-7 | 40 | 5 | 10 | 290 |
| (1)-8 | 40 | 20 | 10 | 270 |
| (1)-9 | 40 | 30 | 10 | 260 |

PMDA: pyromellitic acid dihydrate
BPDA: 3,4,3',4',-biphenyl tetra carboxylic acid dihydrate
DPE: 4,4'-diaminodiphenyl ether
TODI: tolidineisocyanate
NDI: 1,5-naphthalene diisocyanate <Preparation of Polyamic Acid Solution>

Sample (2)-1

Initially, 0.866 kg (8.00 moles) of paraphenylene diamine (PDA manufactured by Mitui Chemicals) and 1.603 kg (8.00 moles) of 4, 4'-diaminodiphenyl ether (DPE manufactured by Wakayama Chemicals) were prepared. The materials were, in a 60-litter reaction vessel having a jacket and permitting temperature control, dissolved in about 44 kg of solvent which was N-methyl-pyrolidone (NMP manufactured by Mitubishi Chemicals). The dissolution was performed in a nitrogen gas atmosphere. While gradually adding 3.523 kg (16.14 moles) of pyromellitic acid dihydrate (PMDA manufactured by Mitubishi Gas Chemicals) at 50° C., reactions were performed for three hours. Thus, polyamic acid solution containing a solid component of about 12% and having a viscosity at 25° C. of 20 Pa·S was obtained.

Then, the polyamic acid solution was applied to the surface of the copper foil such that the thickness of the film turned into an imide was 25 μm. Then, the solvent was allowed to fly in a continuous furnace, the temperature of which was 80° C. to 160° C., and then the temperature was raised to 230° C. to 350° C. Then, heat treatment was performed at 350° C. for 30 minutes so that the solution was turned into an imide.

Then, an etching process was performed by using cupric chloride solution so that a polyimide film was manufactured.

Samples (2)-2 to (2)-7

A process similar to that for preparing sample (2)-1 was performed except for the type and the ratio of acid dihydrate and aromatic diamine changed as shown in Table 2. Thus, polyamic acid solution was prepared.

The coefficient of linear thermal expansion of the obtained polyimide film was measured as follows. Results were shown in Table 2.

4. Measurement of Coefficient of Linear Thermal Expansion

A thermal mechanical analyzer (TMA)(SCC150CU manufactured by S11) was operated to perform a pulling method under a load of 2.5 g to 5.0 g. Thus, the coefficient of linear thermal expansion was measured in accordance with data for measurement in a temperature range from 100° C. to 350° C.

TABLE 2

| Samples | Type of Acid Dihydrate | Type of Diamine | | Molar Ratio Diamine (a)/(b) | Coefficient of Linear Thermal Expansion ×10⁻⁶/K |
|---|---|---|---|---|---|
| | | Diamine (a) | Diamine (b) | | |
| (2)-1 | PMDA | DPE | PDA | 50/50 | 20 |
| (2)-2 | PMDA | DPE | PDA | 90/10 | 30 |
| (2)-3 | BPDA | DPE | DABA | 25/75 | 20 |
| (2)-4 | BPDA | DPE | PDA | 80/20 | 28 |
| (2)-5 | BPDA | DPE | PDA | 10/90 | 10 |
| (2)-6 | BPDA | DPE | — | 100/0 | 35 |
| (2)-7 | DSDA | DPE | PDA | 90/10 | 39 |

PMDA: pyromellitic acid dihydrate
BPDA: 3,4,3',4',-biphenyl tetra carboxylic acid dihydrate
DSDA: 3,3',-4,4-diphenylsulfone tetracarboxylic acid dihydrate
DPE: 4,4'-diaminodiphenyl ether
DABA: 4,4'-diaminobenzanilide
PDA: paraphenylenediamine Then, the obtained polyamic acid solution was used so that flexible printed boards were manufactured.
<Manufacturing of Flexible Printed Board>

Example 1

Initially, electrolytic copper foil having a thickness of 18 μm (CF-T9-LP manufactured by Fukuda Kinzoku) and a width of 540 μm was prepared. The polyamic acid solution partially turned into an imide according to sample (1)-1 was continuously applied to the surface of the copper foil to have a dry thickness of 2 μm. Thus, first polyimide-precursor-layer was formed. At this time, the residual quantity from volatilization was 25%.

Then, the first polyimide-precursor-layer was continuously coated with the polyamic acid solution according to sample (2)-1 such that the thickness after the imidation was 22 μm. Then, the polyamic acid solution was dried so that the second polyimide-precursor-layer was formed. The residual quantity from volatilization which was the sum of the quantities in the first and second polyimide-precursor-layers was 30%.

The polyamic acid solution according to sample (2)-2 was continuously applied to the polyimide precursor layer such that the thickness after the imidation was 3 μm. At this time, the residual quantity from volatilization which was the sum of the quantities in the first, second and third polyimide precursor layers was 38%.

Then, a metal composite film manufactured by sequentially laminating the first, second and third polyimide precursor layers was subjected to heat treatment at 230° C. in a continuous drying furnace. Thus, excess solvent was volatilized. The residual quantities from volatilization which was the sum of the three layers was 7.9%.

Then, the metal composite film having a length of 100 m was wound around a stainless steel pipe having a diameter of 250 mm such that the copper foil faced inside. The roll shape metal compose film was introduced into a batch oven which permitted nitrogen substitution. Thus, nitrogen gas was introduced into the oven so that nitrogen substitution was performed until the concentration of oxygen was 0.1%. Then, the temperature was raised while the nitrogen gas was being introduced until the temperature was raised 350° C. after a lapse of about one hour.

Then, the temperature of 350° C. was maintained for 15 minutes so that the first, second and third polyimide precursor was completely turned into an imide. Thus, first, second and third polyimide-resin layers were formed. Then, the temperature was lowered to 200° C. in a nitrogen atmosphere, and then the polyimide-resin layers were cooled down in the atmosphere.

The film turned into an imide in a state in which it was wound into the roll shape was unwound so that an elongated flexible printed board was obtained. Examples 2 to 14 and Comparative Examples 1

A process similar to that according to example 1 was performed except for the type and the thickness of the polyimide-resin layer and the residual quantity from volatilization which were changed as shown in Table 3. Thus, flexible printed boards were obtained.

The obtained flexible printed boards were subjected to the following evaluation tests. Results of the tests were shown in Tables 3 and 4.
Method of Evaluation Test
5. Measurement of Residual Quantity From Volatilization The quantity was evaluated with a percentage of all volatilized components contained in the formed metal composite film whenever the polyimide precursor layer was applied and dried.

An assumption is made that the weight of the dried metal composite film was w0, the weight of the flexible printed board formed by performing the imidation was w1 and the weight of a composite polyimide film obtained by an etching process for removing the metal foil from the flexible printed board formed into the imidation was w2. The residual quantity from volatilization was expressed by the following equation (1):

$$\text{Residual Quantity from Volatilization} = (w0-w1) \times 100/\{w0-(w1-w2)\} \quad (1)$$

Therefore, w0 was measured whenever the polyimide precursor layer was formed. Moreover, the polyimide precursor layers were turned into an imide so that w1 and w2 were measured. The obtained values of w0, w1 and w2 were substituted for the foregoing equation (1) so that the residual quantity from volatilization was obtained.

6. Measurement of Bonding Strength

Each of the flexible printed boards according to the examples was again wound into the roll shape to sample an outer portion, an intermediate portion at a position of 50 m apart from the core in the lengthwise direction and a core portion.

Copper foil corresponding to each of the outer portion, the intermediate portion and the core portion was formed by etching to have a width of 1.59 mm. The bonding strength was measured by peeling each copper foil in a direction perpendicular to, that is, 90° from, the surface of the board by a method conforming to the per peel strength JIS C6471.

7. Measurement of Dimension Stability (Coefficient of Contraction)

A laminated board having one side applied with copper was measured by a method per dimensional stability JIS C 6471. Specifically, a 210 mm×210 mm reference was provided for each of the outer portion, the intermediate portion and the core portion of each flexible printed board according to the example. The distances among the references were measured. Then, the copper foil was removed by etching so that a composite polyimide film was measured. Then, the composite polyimide film was dried, and then the distances among the references realized after etching and drying were measured. The ratio with respect to the distances among the references of the flexible printed board was calculated so that the dimensional stability was obtained. Moreover, the dimensional stability realized after heat treatment was measured by leaving the composite polyimide film at 280° C. for 10 minutes.

8. Measurement of Curling

The flexible printed board was cut to have a size of 100 mm×100 mm so that test pieces were manufactured. The test pieces were allowed to stand at room temperature. Then, the curvature radius was calculated from the average height of four corners when the test pieces were placed on a horizontal plate such that the lower surface of the test pieces faced downward. After the test piece was allowed to stand at 260° C. for a predetermined time, the curvature radius of the curl was calculated.

The copper foil of the flexible printed board according to each example was removed by etching so that composite polyimide films were manufactured. The curvature radius of each of the composite polyimide films was measured at room temperature and 260° C. by a method similar to the foregoing method.

TABLE 3

| | First Polyimide-Resin Layer | | | Second Polyimide-Resin Layer | | |
|---|---|---|---|---|---|---|
| Example | Samples | Thickness (μm) | Residual Quantity from Volatilization (%) | Samples | Thickness (μm) | Residual Quantity from Volatilization (%) |
| 1 | (1)1 | 2 | 25 | (2)1 | 22 | 30 |
| 2 | (1)3 | 2 | 25 | (2)1 | 22 | 32 |
| 3 | (1)4 | 2 | 27 | (2)1 | 24 | 38 |
| 4 | (1)1 | 2 | 25 | (2)3 | 20 | 35 |
| 5 | (1)7 | 2 | 25 | (2)3 | 22 | 30 |
| 6 | (1)8 | 2 | 26 | (2)3 | 22 | 31 |
| 7 | (1)9 | 2 | 25 | (2)3 | 23 | 30 |
| 8 | (1)8 | 2 | 25 | (2)5 | 22 | 33 |
| 9 | (1)1 | 2 | 25 | (2)2 | 22 | 30 |
| 10 | (1)1 | 2 | 26 | (2)6 | 22 | 35 |
| 11 | (1)1 | 2 | 27 | (2)6 | 22 | 35 |
| 12 | (1)2 | 2 | 26 | (2)1 | 22 | 35 |
| 13 | (1)5 | 2 | 28 | (2)1 | 24 | 40 |
| 14 | (1)6 | Coating Impossible | | — | — | — |
| Comparative Example 1 | (2)2 | 2 | 25 | (2)1 | 22 | 32 |

| | Third Polyimide-Resin Layer | | | Previous Imidation Ratio | Coefficient of Linear Thermal Expansion | |
|---|---|---|---|---|---|---|
| Example | Samples | Thickness (μm) | Residual Quantity from Volatilization (%) | First Polyimide Layer (%) | Second Polyimide Layer × $10^{-6}$/K. | Third Polyimide Layer × $10^{-6}$/K. |

TABLE 3-continued

| | | | | | | |
|---|---|---|---|---|---|---|
| 1 | (2)2 | 3 | 38 | 40 | 20 | 30 |
| 2 | (2)2 | 3 | 40 | 30 | 20 | 30 |
| 3 | (2)2 | 3 | 36 | 50 | 20 | 30 |
| 4 | (2)4 | 3 | 40 | 40 | 20 | 28 |
| 5 | (2)4 | 3 | 39 | 40 | 20 | 28 |
| 6 | (2)4 | 3 | 38 | 40 | 20 | 28 |
| 7 | (2)4 | 3 | 38 | 40 | 20 | 28 |
| 8 | (2)6 | 3 | 39 | 40 | 10 | 35 |
| 9 | (2)6 | 3 | 39 | 40 | 30 | 35 |
| 10 | (2)7 | 3 | 41 | 40 | 35 | 39 |
| 11 | (2)5 | 3 | 39 | 40 | 35 | 10 |
| 12 | (2)2 | 3 | 38 | 10 | 20 | 30 |
| 13 | (2)2 | 3 | 36 | 70 | 20 | 30 |
| 14 | — | — | — | 80 | — | — |
| Comparative Example 1 | (2)2 | 3 | 40 | 0 | 20 | 30 |

TABLE 4

| | Stability of Bonding Strength (kgf/cm) | | |
|---|---|---|---|
| Examples | Outer Portion | Intermediate Portion | Core Portion |
| 1 | material broken | 2.50 | material broken |
| 2 | material broken | 2.00 | 2.25 |
| 3 | material broken | material broken | material broken |
| 4 | material broken | 2.45 | material broken |
| 5 | material broken | 2.55 | material broken |
| 6 | material broken | material broken | material broken |
| 7 | material broken | 2.35 | 2.50 |
| 8 | material broken | 2.50 | material broken |
| 9 | 2.35 | 1.60 | 2.00 |
| 10 | 2.25 | 0.25 | 1.55 |
| 11 | 2.55 | 0.30 | 0.85 |
| 12 | 2.50 | 1.50 | 2.25 |
| 13 | 1.95 | 1.80 | 1.80 |
| 14 | measurement impossible because of inhibition of coating | | |
| Comparative Example 1 | 2.40 | 0.35 | 1.85 |

| | Dimensional Stability (Coefficient of Contraction)(%) (a) after etching (b) after heat treatment | | |
|---|---|---|---|
| Examples | Outer Portion | Intermediate Portion | Core portion |
| 1 | (a) 0.008 (b) −0.075 | (a) 0.008 (b) −0.080 | (a) 0.007 (b) −0.072 |
| 2 | (a) 0.010 (b) −0.065 | (a) 0.025 (b) −0.120 | (a) 0.010 (b) −0.095 |
| 3 | (a) 0.007 (b) −0.077 | (a) 0.007 (b) −0.060 | (a) 0.007 (b) −0.055 |
| 4 | (a) 0.008 (b) −0.075 | (a) 0.008 (b) −0.080 | (a) 0.007 (b) −0.072 |
| 5 | (a) 0.007 (b) −0.055 | (a) 0.010 (b) −0.055 | (a) 0.009 (b) −0.055 |
| 6 | (a) 0.006 (b) −0.065 | (a) 0.007 (b) −0.050 | (a) 0.007 (b) −0.050 |
| 7 | (a) 0.006 (b) −0.070 | (a) 0.009 (b) −0.110 | (a) 0.007 (b) −0.085 |
| 8 | (a) 0.007 (b) −0.055 | (a) 0.010 (b) −0.055 | (a) 0.009 (b) −0.055 |
| 9 | measurement impossible because of excessive curling | | |
| 10 | measurement impossible because of excessive curling | | |
| 11 | measurement impossible because of excessive curling | | |
| 12 | (a) 0.012 (b) −0.065 | (a) 0.025 (b) −0.120 | (a) 0.015 (b) −0.086 |
| 13 | (a) 0.015 (b) −0.100 | (a) 0.020 (b) −0.125 | (a) 0.020 (b) −0.095 |
| 14 | measurement impossible because of inhibition of coating | | |
| Comparative Example 1 | (a) 0.007 (b) −0.110 | (a) 0.010 (b) −0.145 | (a) 0.009 (b) −0.105 |

| | Curl (Curvature Radius) mm | | | |
|---|---|---|---|---|
| | Flexible Printed Board | | Composite Film | |
| | Ordinary State | 260° C. | Ordinary State | 260° C. |
| 1 | Flat ∞ | Flat ∞ | Flat ∞ | Flat ∞ |
| 2 | Flat ∞ | curl 500 mm | Flat ∞ | Flat ∞ |
| 3 | Flat ∞ | Flat ∞ | Flat ∞ | Flat ∞ |
| 4 | Flat ∞ | Flat ∞ | Flat ∞ | Flat ∞ |
| 5 | Flat ∞ | Flat ∞ | Flat ∞ | Flat ∞ |
| 6 | Flat ∞ | Flat ∞ | Flat ∞ | Flat ∞ |
| 7 | Flat ∞ | Flat ∞ | Flat ∞ | Flat ∞ |
| 8 | Flat ∞ | Flat ∞ | Flat ∞ | Flat ∞ |
| 9 | curl 50 mm | curl 10 mm | curl 100 mm | curl 50 mm |
| 10 | curl 10 mm | curl 10 mm | curl 50 mm | curl 10 mm |
| 11 | curl 50 mm | curl 10 mm | curl 100 mm | curl 50 mm |
| 12 | curl 500 mm | curl 200 mm | Flat ∞ | Flat ∞ |
| 13 | curl 300 mm | curl 100 mm | Flat ∞ | Flat ∞ |
| 14 | measurement impossible because of inhibition of coating | | | |
| Comparative Example 1 | Flat ∞ | curl 300 mm | curl 500 mm | curl 200 mm | which incorporated the first polyimide-resin layer formed by using the varnish for the first polyimide precursor partially turned into an imide by diisocyanate exhibited excellent bonding strength with the copper foil. Moreover, dispersion of the bonding strength in the outer portion, the intermediate portion and the core portion was restrained. In addition, examples 1 to 14 were free from considerable dispersion of the coefficient of contraction, that is, the dimensional stability in the outer portion, the intermediate portion and the core portion.

The comparative example which was not employed varnish for a polyimide precursor partially turned into an imide by the diisocyanate had poor bonding strength with the copper foil. The bonding strength dispersed in the outer portion, the intermediate portion and the core portion. What is worse, the comparative example encountered excessive coefficient of contraction, that is, the dimensional stability was unsatisfactory. Moreover, great dispersion in the coefficient of contraction took place in the outer portion, the intermediate portion and the core portion.

Moreover, examples 1 to 14 were free from considerable curling as compared with the comparative example.

As a result, the first polyimide-resin layer made contact with the copper foil was formed by forming the polyimide precursor previously partially turned into an imide by the diisocyanate enabled the bonding strength with the copper foil. Moreover, dispersion of the bonding strength in the outer portion, the intermediate portion and the core portion was prevented. Thus, the quality was significantly uniformed and the dimensional stability was improved. In addition, curling was restrained.

Example 14 had the previous imidation ratio of 80 mol %, the previous imidation ratio being the previous imidation ratio of the polyimide precursor which was the material of the first polyimide-resin layer. Coating of the varnish for a polyimide precursor was inhibited. As a result, a preferred previous imidation ratio of the polyamic acid solution which was the material of the first polyimide-resin layer was 10 mol % to 70 mol % as was employed in examples 1 to 13.

Examples 1 to 11 in which the previous imidation ratio was 30 mol % to 50 mol % had the bonding strength superior to those of examples 12 and 13 which had the previous imidation ratio which did not satisfy the above-mentioned range. Moreover, curling was furthermore prevented. Thus, a preferred previous imidation ratio of the polyamic acid solution which was the material of the first polyimide-resin layer was 30 mol % to 50 mol %.

Examples 9 to 11 had the coefficient of linear thermal expansion of the second polyimide-resin layer formed on the first polyimide-resin layer of $30 \times 10^{-6}$/K or higher. As compared with examples 1 to 7 having the coefficient of linear thermal expansion of the second and third polyimide-resin layer of $30 \times 10^6$/K or lower, examples 9 to 11 encountered excessive occurrence of curling. Therefore, a fact was found that the effect of preventing curling deteriorates if the coefficient of linear thermal expansion of the second polyimide-resin layer formed on the first polyimide-resin layer was higher than $30 \times 10^{-6}$/K. Thus, a fact was found that a preferred coefficient of linear thermal expansion of the second polyimide-resin layer formed on the first polyimide-resin layer was $30 \times 10^{-6}$/K or lower.

As described above, the flexible printed board according to the present invention has the structure that the polyimide precursor which is the material of the first polyimide-resin layer which is made contact with the conductor is previously turned into an imide partially before the imidation is performed. Therefore, contraction of the material occurring when the polyimide precursor is turned into an imide can satisfactorily be prevented.

As a result, the flexible printed board according to the present invention enables the bonding strength between the conductor and the first polyimide-resin layer to be increased. Moreover, dispersion of the bonding strength can be prevented and, therefore, the quality can satisfactorily be uniformed. In addition, curling can satisfactorily be prevented and excellent flatness was obtained. That is, a significant quality can be obtained.

The method of manufacturing the flexible printed board according to the present invention uses the material previously turned into an imide partially before the imidation is formed. The material previously turned into an imide partially is employed as the polyimide precursor which is the material of the first polyimide-resin layer made contact with the conductor. Therefore, contraction of the material caused from the imidation of the polyimide precursor which is the material of the first polyimide-resin layer can satisfactorily be prevented.

As a result, the method of manufacturing the flexible printed board according to the present invention is able to manufacture a flexible printed board in which the bonding strength between the conductor and the first polyimide-resin layer can be increased, the quality of which can satisfactorily be uniformed, in which curling can satisfactorily be prevented and which exhibits excellent flatness and an excellent quality.

Although the invention has been described in its preferred form and structure with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of manufacturing a flexible printed board comprising the steps of:

forming a first polyimide-precursor-layer by coating a conductor with varnish having a glass transition temperature of 250° C. or higher for a first polyimide precursor containing polyamic acid components prepared owing to reactions of acid anhydride and amine and expressed by a following chemical formula (3) and polyimide components prepared owing to reactions of acid anhydride and isocyanate and expressed by a following chemical formula (4); coating a surface of the first polyimide-precursor-layer with varnish for a second polyimide precursor composed of polyamic acid components prepared owing to reactions of acid anhydride and amine; and subjecting said first and second polyimide-precursor-layers to heat treatment so as to turn said first and second polyimide precursors into an imide so that said first and second polyimide-resin layers are formed, wherein a residual quantity of non-dried solvent and condensed water from volatization of said first and second polyimide-precursor-layers is 30% to 50%:

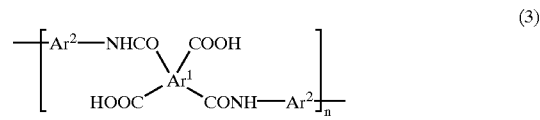

(3)

where each of $Ar^1$ and $Ar^2$ is an aromatic group and n is an integer

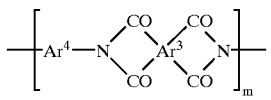

(4)

where each of $Ar^3$ and $Ar^4$ is an aromatic group and m is an integer.

2. The method of manufacturing the flexible printed board according to claim 1, wherein
said varnish for said second polyimide precursor has a coefficient of linear thermal expansion of $30 \times 10^{-6}$/K realized after the imidation has been completed.

3. The method of manufacturing the flexible printed board according to claim 1, wherein
said first polyimide-precursor-layer is repeatedly coated with said varnish for said second polyimide precursor, and then said varnish for said second polyimide precursor is dried so that said second polyimide-precursor-layer is in the form of a multiple layer structure.

4. The method of manufacturing the flexible printed board according to claim 1, wherein
said varnish for said first polyimide precursor contains the polyimide component expressed by chemical formula (4) in a range from 10% to 70%.

5. The method of manufacturing said flexible printed board according to claim 1, wherein said varnish for said first polyimide precursor contains said polyimide component expressed by chemical formula (4) in a range from 30% to 50%.

6. The method of manufacturing the flexible printed board according to claim 1, further comprising
volatilizing solvent from said first and second polyimide-precursor-layers in a predetermined quantity in a temperature range with which an imidation of said first polyimide-precursor-layer is not enhanced, said step of volatizing being performed before said first and second polyimide-precursor-layers are turned into an imide.

* * * * *